United States Patent
Danilov et al.

(10) Patent No.: US 10,572,191 B1
(45) Date of Patent: Feb. 25, 2020

(54) DISASTER RECOVERY WITH DISTRIBUTED ERASURE CODING

(71) Applicant: EMC IP Holding Company LLC, Hopkinton, MA (US)

(72) Inventors: Mikhail Danilov, Saint Petersburg (RU); Kirill Zakharov, Saint Petersburg (RU)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 50 days.

(21) Appl. No.: 15/792,714

(22) Filed: Oct. 24, 2017

(51) Int. Cl.
| | |
|---|---|
| *G06F 11/00* | (2006.01) |
| *G06F 3/06* | (2006.01) |
| *G06F 9/50* | (2006.01) |
| *H03M 13/37* | (2006.01) |
| *G06F 11/07* | (2006.01) |
| *G06F 16/28* | (2019.01) |

(52) U.S. Cl.
CPC .......... *G06F 3/0683* (2013.01); *G06F 3/0617* (2013.01); *G06F 9/5083* (2013.01); *G06F 11/0727* (2013.01); *G06F 16/285* (2019.01); *H03M 13/373* (2013.01)

(58) Field of Classification Search
CPC .. G06F 11/0727; G06F 3/0683; G06F 16/285; G06F 3/0617; G06F 9/5083; H03M 13/373
USPC ......................................................... 714/6.2
See application file for complete search history.

(56) References Cited

U.S. PATENT DOCUMENTS

| | | |
|---|---|---|
| 9,208,009 B2 | 12/2015 | Resch et al. |
| 2008/0222480 A1 | 9/2008 | Huang et al. |
| 2008/0222481 A1 | 9/2008 | Huang et al. |
| 2008/0244353 A1 | 10/2008 | Dholakia et al. |
| 2009/0183056 A1 | 7/2009 | Aston |
| 2009/0240880 A1 | 9/2009 | Kawaguchi |
| 2011/0029836 A1 | 2/2011 | Dhuse et al. |
| 2011/0106972 A1 | 5/2011 | Grube et al. |
| 2011/0107165 A1 | 5/2011 | Resch et al. |
| 2012/0191675 A1 | 7/2012 | Kim et al. |
| 2012/0311395 A1 | 12/2012 | Leggette et al. |
| 2013/0238932 A1* | 9/2013 | Resch ..................... G06F 21/64 714/20 |
| 2013/0290482 A1 | 10/2013 | Leggette |

(Continued)

OTHER PUBLICATIONS

Wikipedia "Garbage Collection" page from date Sep. 8, 2017, retrieved using the WayBackMachine from https://en.wikipedia.org/wiki/Garbage_collection_(computer_science)#Availability (Year: 2017).*

(Continued)

*Primary Examiner* — Yair Leibovich
(74) *Attorney, Agent, or Firm* — Amin, Turocy & Watson, LLP

(57) ABSTRACT

Processing load for remote zones and inter-zone network traffic during geographically distributed (GEO) erasure coding can be reduced. In one aspect, GEO erasure coding can be performed in two phases, wherein each phase can be distributed between zones. Moreover, during a first phase, partially-finished coding chunks can be generated and provided to the remote zones. Further, during a second phase the remote zones can combine the received partially-finished coding chunks independently, to generate a complete coding chunk that can be utilized for data recovery.

20 Claims, 10 Drawing Sheets

(56) References Cited

U.S. PATENT DOCUMENTS

| | | | |
|---|---|---|---|
| 2014/0040417 A1* | 2/2014 | Gladwin | G06F 11/2053 709/214 |
| 2014/0115182 A1 | 4/2014 | Sabaa et al. | |
| 2014/0164694 A1 | 6/2014 | Storer | |
| 2014/0281804 A1 | 9/2014 | Resch | |
| 2014/0331100 A1 | 11/2014 | Dhuse et al. | |
| 2015/0074065 A1 | 3/2015 | Christ et al. | |
| 2015/0112951 A1 | 4/2015 | Narayanamurthy et al. | |
| 2015/0142863 A1 | 5/2015 | Yuen et al. | |
| 2015/0178007 A1 | 6/2015 | Moisa et al. | |
| 2015/0186043 A1 | 7/2015 | Kesselman et al. | |
| 2016/0378624 A1 | 12/2016 | Jenkins, Jr. et al. | |
| 2017/0017671 A1 | 1/2017 | Baptist et al. | |
| 2017/0031945 A1 | 2/2017 | Sarab et al. | |
| 2017/0187766 A1 | 6/2017 | Zheng et al. | |
| 2018/0267985 A1 | 9/2018 | Badey et al. | |
| 2019/0114223 A1* | 4/2019 | Pydipaty | G06F 11/1068 |
| 2019/0215017 A1* | 7/2019 | Danilov | G06F 11/1032 |

OTHER PUBLICATIONS

Wikipedia "Erasure code" page from date Sep. 8, 2017, retrieved using the WayBackMachine from https://web.archive.org/web/20170908171158/https://en.wikipedia.org/wiki/Erasure_code (Year: 2017).*

Wikipedia "Front and back ends" page from date Sep. 6, 2019, retrieved from https://en.wikipedia.org/wiki/Front_and_back_ends (Year: 2019).*

Notice of Allowance received for U.S. Appl. No. 15/862,547 dated Mar. 29, 2019 27 pages.

Non-Final Office Action received for U.S. Appl. No. 15/791,390 dated Sep. 20, 2019, 27 pages.

\* cited by examiner

DISASTER RECOVERY WITH DISTRIBUTED ERASURE CODING

TECHNICAL FIELD

The subject disclosure relates generally to distributed erasure coding. More specifically, this disclosure relates to disaster recovery with distributed erasure coding.

BACKGROUND

The large increase in amount of data generated by digital systems has created a new set of challenges for data storage environments. Traditional storage area network (SAN) and/or network-attached storage (NAS) architectures have not been designed to support data storage or protection at large multi-petabyte capacity levels. Object storage technology can be utilized to meet these requirements. By utilizing object storage technology, organizations can not only keep up with rising capacity levels, but can also store these new capacity levels at a manageable cost point.

Typically, a scale-out, cluster-based, shared-nothing object storage that employs a microservices architecture pattern, for example, an Elastic Cloud Storage (ECS) can be utilized as a storage environment for a new generation of workloads. ECS utilizes the latest trends in software architecture and development to achieve increased availability, capacity use efficiency, and performance. ECS uses a specific method for disk capacity management, wherein disk space is partitioned into a set of blocks of fixed size called chunks. User data is stored in these chunks and the chunks are shared. One chunk can contain fragments of several user objects. Chunk content is modified in an append mode. When chunks become full, they are sealed and the content of sealed chunks is immutable.

A corresponding feature of ECS supports geographically distributed setups (GEO) comprising two or more zones. When three or more zones are employed, each zone may receive chunks from other zones and the zones can combine the chunks. This type of cluster-based storage of several racks supports cluster nodes that communicate with each other. One cluster may be located in one data center and another cluster can be located in a remote data center. Although the geographically distributed setups can be used to provide an additional protection of user data by means of replication, the replication mechanism works at the chunks level.

The above-described background relating to ECS is merely intended to provide a contextual overview of some current issues, and is not intended to be exhaustive. Other contextual information may become further apparent upon review of the following detailed description.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its sole purpose is to present some concepts of the specification in a simplified form as a prelude to the more detailed description that is presented in this disclosure.

Example systems and methods disclosed herein relate to facilitating distributed erasure coding to load balance between different geographical zones of a distributed storage system and reduce inter-zone network traffic. In one example embodiment, a system is disclosed that comprises a processor and a memory that stores executable instructions that, when executed by the processor, facilitate performance of operations. Moreover, the operations comprise receiving a first partial coding chunk from a first zone of a geographically distributed storage system, wherein the first partial coding chunk is determined based on performing a first portion of an erasure coding operation that encodes a first data chunk stored within the first zone. Further, the operations comprise receiving a second partial coding chunk from a second zone of the geographically distributed storage system, wherein the second partial coding chunk is determined based on performing the first portion of the erasure coding operation that encodes a second data chunk stored within the second zone. Furthermore, the operations comprise performing a second portion of the erasure coding operation that comprises combining the first partial coding chunk and the second partial coding chunk to generate a final coding chunk.

Another example embodiment of the specification relates to a method that comprises receiving, by a system comprising a processor, a first partial coding chunk from a first zone of a geographically distributed storage system, wherein the first partial coding chunk has been determined based on partially encoding a first data chunk stored within the first zone by utilizing a defined erasure coding scheme, and receiving, by the system, a second partial coding chunk from a second zone of the geographically distributed storage system, wherein the second partial coding chunk has been determined based on partially encoding second data chunk stored within the second zone by utilizing the defined erasure coding scheme. According to an aspect, the method further comprises based on aggregating the first partial coding chunk and the second partial coding chunk determining, by the system, a final coding chunk that is employable for recovery of at least one of the first data chunk or the second data chunk during a failure.

Another example embodiment of the specification relates to a computer-readable storage medium comprising instructions that, in response to execution, cause a computing node device comprising a processor to perform operations, comprising in response to determining that data chunks stored within respective zones of a geographically distributed storage system are to be protected via erasure coding, determining groups of partial coding chunks that are partially encoded versions of the data chunks; and facilitating a transfer of the groups of partial coding chunks to remote zones of the geographically distributed storage system to facilitate generation of complete coding chunks that are employable to recover at least one of the data chunks during a failure.

The following description and the drawings set forth certain illustrative aspects of the specification. These aspects are indicative, however, of but a few of the various ways in which the principles of the specification may be employed. Other advantages and novel features of the specification will become apparent from the detailed description of the specification when considered in conjunction with the drawings.

DETAILED DESCRIPTION

Figure 1:
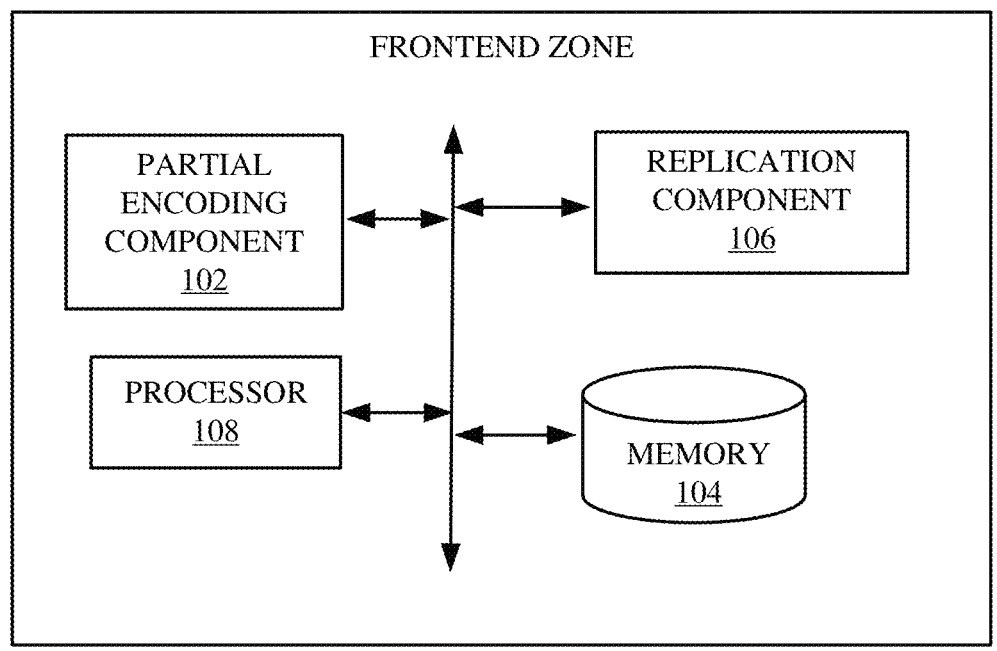
FIG. 1 illustrates an example frontend zone configured to perform distributed erasure coding.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

The term "cloud" as used herein can refer to a cluster of nodes (e.g., set of network servers), for example, within a distributed object storage system, that are communicatively and/or operatively coupled to each other, and that host a set of applications utilized for servicing user requests. In general, the cloud computing resources can communicate with user devices via most any wired and/or wireless communication network to provide access to services that are based in the cloud and not stored locally (e.g., on the user device). A typical cloud-computing environment can include multiple layers, aggregated together, that interact with each other to provide resources for end-users.

Example systems and methods disclosed herein, in one or more embodiments, relate to an elastic cloud storage (ECS) platform that can combine the cost advantages of commodity infrastructure with the reliability, availability and serviceability of traditional arrays. In one aspect, the ECS platform can comprise a cluster of nodes (also referred to as "cluster" herein) that delivers scalable and simple public cloud services with the reliability and/or control of a private-cloud infrastructure. Moreover, the ECS platform comprises a scale-out, cluster-based, shared-nothing object storage, which employs a microservices architecture pattern. The ECS platform can support storage, manipulation, and/or analysis of unstructured data on a massive scale on commodity hardware. As an example, ECS can support mobile, cloud, big data, and/or social networking applications. ECS can be deployed as a turnkey storage appliance or as a software product that can be installed on a set of qualified commodity servers and/or disks. The ECS scale-out and geo-distributed architecture is a cloud platform that can provide at least the following features: (i) lower cost than public clouds; (ii) unmatched combination of storage efficiency and data access; (iii) anywhere read/write access with strong consistency that simplifies application development; (iv) no single point of failure to increase availability and performance; (v) universal accessibility that eliminates storage silos and inefficient extract, transform, load (ETL)/data movement processes; etc. ECS does not employ traditional data protection schemes like mirroring or parity protection. Instead, ECS utilizes erasure coding for data protection. Although the systems and methods disclosed herein have been described with respect to object storage systems (e.g., ECS), it is noted that the subject specification is not limited to object storage systems and can be utilized for most any geo-distributed storage systems that utilize erasure coding for data protection.

Example systems and methods disclosed herein, in one or more embodiments, relate to geographically distributed (GEO) erasure coding, which inherits all the issues of GEO XOR except low scalability. Typically, organizations protect against outages or information loss by backing-up (e.g., replicating) their data periodically. During backup, one or more duplicate or deduplicated copies of the primary data are created and written to a new disk or to a tape. For disaster recovery purposes, a backup copy needs to be transported or replicated offsite to ensure the data is safe in the event of a disaster. A single point of failure is a risk of data loss and/or system unavailability. A single device, building, metropolitan area, power grid, natural disaster zone (e.g., flood zone, earthquake zone, hurricane zone, etc.), accident/attack zone (e.g., malicious attack) can represent a single point of failure. Redundancy and the distance that spans those points of failure can enable disaster recovery to keep the organizations operating smoothly regardless of the cause of the unplanned outage. In some scenarios, ECS can utilize an XOR technique to minimize capacity overhead associated with GEO data protection. However, the XOR technique is not scalable and the use of GEO XOR can enables a distributed storage to recover data from a failure of a single zone and/or cluster and/or chunk in the distributed storage. However, GEO XOR cannot help recover data from a dual failure or from more complicated failures.

In one aspect, the systems and methods herein relate to providing disaster recovery by utilizing GEO erasure coding, wherein data can be replicated on storage devices deployed at different physical locations (e.g., at geographically separated zones/sites around the world). Thus, data can easily be recovered if one or more zones/sites experience an outage/failure (e.g., dual failure or more complicated failure). Erasure coding can be used to protect data on geographically distributed storages instead of basic XOR. However, there are several challenges with inter-zone network traffic efficiency.

Erasure coding was created as a forward error correction method for binary erasure channel. However, erasure coding can be used for data protection on data storages. During erasure coding, a piece of data can be divided into k data fragments of equal size. During encoding, redundant m coding fragments are created so that the system can tolerate the loss of any m fragments. The process of coding fragments creation is called encoding. The process of data fragments recovery using available data and coding fragments is called decoding.

If a distributed storage is to tolerate the loss of any m zones/clusters/chunks, then GEO erasure coding can begin at each zone by replicating each new chunk to at least m remote zones. As a result, there are m backup copies of each chunk. Typically, there is one primary backup copy, which can be utilized for encoding. Encoding is performed by one zone for primary backup chunks and other zones replicate to it. Once a zone has k primary chunks replicated from different remote zones, the zone can perform encoding using the chunks replicated to it as data fragments. The chunk size is fixed, in ECS, with padding or other data to complement, wherein the other data is added as needed. The result of encoding is m data portions of a chunk size. They are stored as chunks of a specific type called coding chunks. After encoding is complete, the zone can store one coding chunk locally and move other m−1 coding chunks to remote zones making sure all the k+m data and coding chunks are stored at different zones whenever possible. Afterwards, the primary backup chunks used for encoding and their peer backup chunks at other zones can be deleted.

The above encoding operation can be very resource-demanding. Typically, it is normal to have a considerable lag between new data creation and encoding for systems with high load. However, this can create challenges during distributed erasure coding. For example, backend zones can become overloaded with encoding. In this example scenario, until data protection with GEO erasure coding is completed, backup copies of data in each backend zone occupy k times more capacity than primary data copies in each frontend zone and thus, the backend zones can quickly run out of capacity. This can result in stuck replication and new data created within frontend zones can become vulnerable. Further, backend zones can produce unwanted inter-zone network traffic while distributing coding fragments between themselves. Meanwhile, inter-zone network traffic can be already high because of replication of each data chunks to m backend zones.

The systems and methods disclosed herein reduce load for backend zones and reduce inter-zone network traffic. Moreover, in one aspect, encoding can be performed in two phases and each phase can be distributed between geographical zones. Further, in another aspect, coding chunks can be generated in a distributed manner by their target home zones. This eliminates inter-zone network traffic that is traditionally produced during coding fragments distribution between zones. Typically, in a geographically distributed data storage system, chunks from frontend storage devices (e.g., within frontend zones) can be replicated on a backend storage device (e.g., within backend zones). As an example, frontend storage devices can comprise storage devices that are generally designated, configured, etc., explicitly as a user-facing storage device that create chunks from received user data, while backend storage devices can comprise storage devices that are generally designated, configured, etc., explicitly as non-user-facing storage devices that store chunks from front-end devices but that typically don't receive user data to create new chunks. Generally, a frontend storage device and a backend storage device are not interchangeable without re-configuration to an operator designated frontend or backend data storage role.

Referring initially to FIG. 1, there illustrated is an example frontend zone 100 configured to perform distributed erasure coding. As an example, a frontend zone 100 can comprise one or more nodes that can accept storage requests from storage clients and can store data chunks within memory 104. In the embodiment shown in FIG. 1, the frontend zone 100 can comprise a partial encoding component 102 that can generate a portion of an encoding operation utilized during erasure coding. For example, the encoding operation can be represented with the equation below:

$$C_i = \sum_{j=1}^{k} C_{i,j} \quad (1)$$

wherein, $$C_{i,j} = X_{i,j} * D_j \quad (2)$$

and wherein, $X_{i,j}$ are defined coefficients from a coding matrix. Further, $D_j$ are independent data chunks and $C_i$ are coding chunks. All data/coding chunks united in one protection set are stored in different zones. According to an embodiment, the partial encoding component 102 can determine a set of $C_{i,j}$ for data chunks $D_j$ that are stored within the frontend zone 100 (e.g., within memory 104). This first phase of the encoding operation can be performed in parallel (e.g., simultaneously and/or substantially simultaneously) by different frontend zones. Since, $D_j$ is stored in locally and $X_{i,j}$ is a defined coefficient (e.g., stored within memory 104), the first phase does not utilize inter-zone network traffic/communication.

A replication component 106 can replicate m partially-finished coding chunks ($C_{i,j}$) (e.g., generated by the partial encoding component 102) to destination zones (e.g., remote/backend zones). In one aspect, all partially-finished coding chunks of one finished/complete coding chunk are to be replicated to one destination zone. In an example scenario, wherein m backend zones are utilized, the backend zones can be ordered by an identifier (e.g., name, serial number, etc.) such that chunks $C_{1,j}$ are replicated to a first backend zone, chunks $C_{2,j}$ are replicated to a second backend zone, and so on. After replication, the partially-finished coding chunks can be deleted from memory 104. It should be noted that replicating the partially-finished coding chunks can occur by copying the partially-finished coding chunks at their respective zones and then sending a copied data chunk to a remote zone (e.g., backend zone), or the remote zone can be in bi-directional communication with a first zone, wherein a copy of the partially-finished coding chunk of the first zone is created remotely at the remote zone.

Aspects of the processor 108 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described herein. In an aspect, memory 104 can store computer executable components and instructions. It is noted that the memory 104 can comprise volatile memory(s) or nonvolatile memory(s), or can comprise both volatile and nonvolatile memory(s). Examples of suitable types of volatile and non-volatile memory are described below with reference to FIG. 10. The memory (e.g., data stores, databases) of the subject systems and methods is intended to comprise, without being limited to, these and any other suitable types of memory. In one example, frontend zone 100 can be part of most any object storage system such as, but not limited to, Dell EMC® Elastic Cloud Storage (ECS™).

Figure 2:
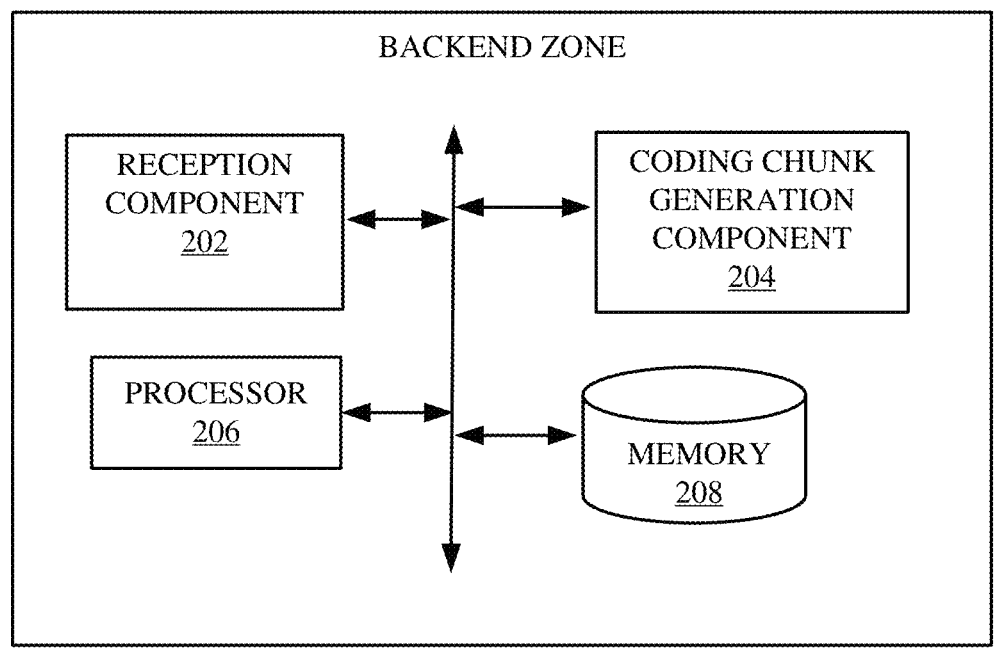
FIG. 2 illustrates an example backend zone configured to perform distributed erasure coding.

FIG. 2 illustrates an example backend zone 200 configured to perform distributed erasure coding. As an example, the backend zone 200 can comprise one or more nodes utilized as replication targets/destinations for the frontend zones. Moreover, the backend zone 200 can be solely utilized to produce and store coding chunks for all the data chunks produced by the frontend zones. In the embodiment shown in FIG. 2, the backend zone 200 can comprise a reception component 202 that can receive partially-finished coding chunks from frontend zones (e.g., frontend zone 100). A coding chunk generation component 204 can be utilized to combine (e.g., add) the partially-finished coding chunks to generate a complete coding chunk. In one aspect, different backend zones can generate respective coding chunks $C_i$ simultaneously or in parallel. As an example, $C_i$ is a sum of $C_{i,j}$ provided by the frontend zones. The result of the sum is stored locally (e.g., to memory 208) as a complete/finished coding chunk $C_i$. This is the final phase of encoding. After all the complete/finished coding chunks are stored in memory 208, the source partially-finished coding chunks can be deleted from memory 104.

Aspects of the processor 206 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described herein. In an aspect, memory 208 can store computer executable components and instructions. It is noted that the memory 208 can comprise volatile memory(s) or nonvolatile memory(s), or can comprise both volatile and nonvolatile memory(s). Examples of suitable types of volatile and non-volatile memory are described below with reference to FIG. 10. In one example, backend zone 200 can be part of most any object storage system such as, but not limited to, Dell EMC® Elastic Cloud Storage (ECS™).

Figure 3:
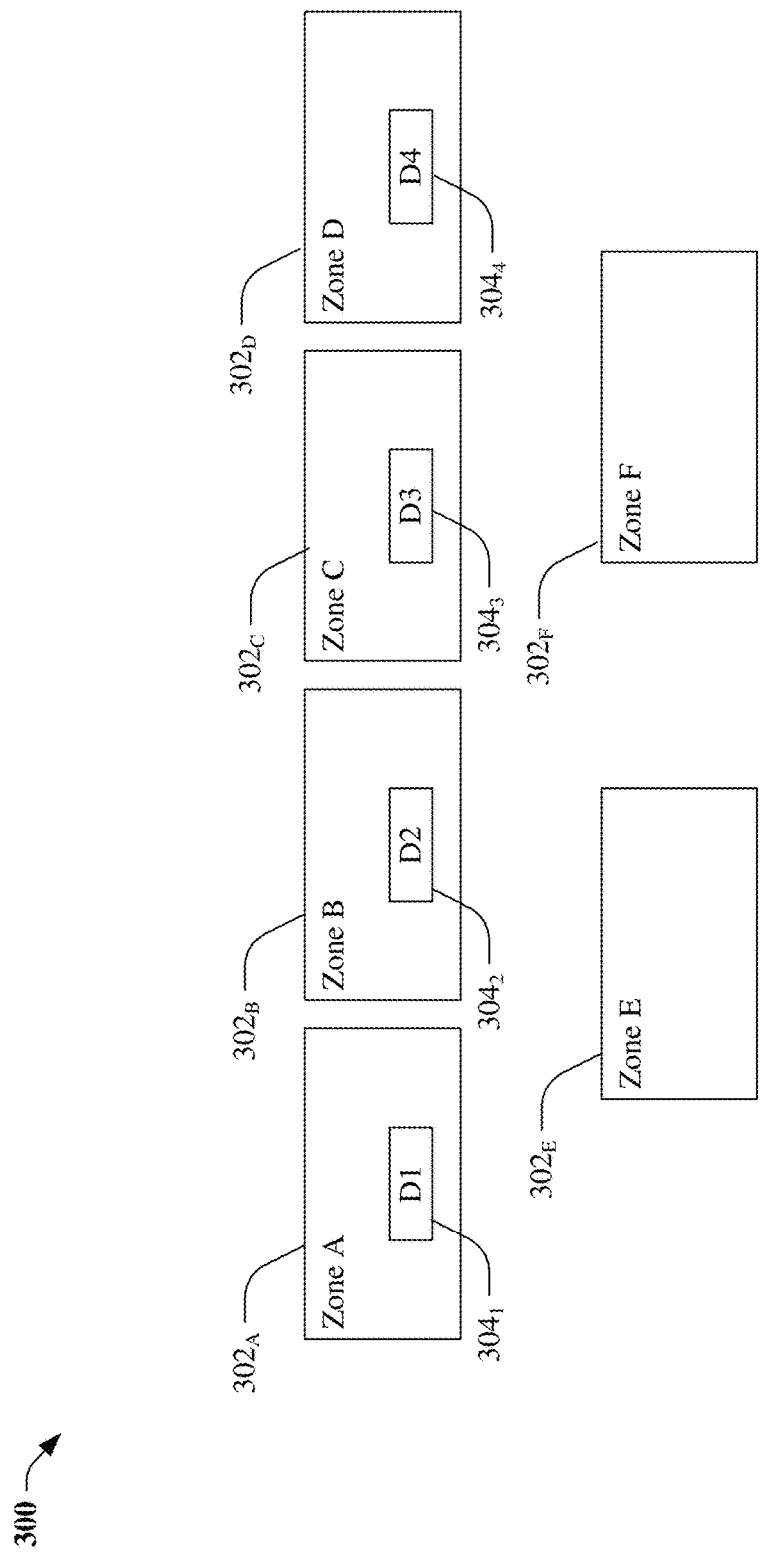
FIG. 3 illustrates an example system with data chunks that are to be protected with geographically distributed erasure coding.

Referring now to FIG. 3, there is illustrated an example system 300 comprising four data chunks protected with GEO distributed erasure coding. System 300 comprises are six geographically distributed zones, zone A $302_A$, zone B $302_A$, zone C $302_C$, zone D $302_D$, zone E $302_E$, and zone F $302_F$. As an example, the zones A-F can be geographically dispersed systems that are linked via a wide area network (WAN) to bi-directionally replicate data among the zones. The geo-replication ensures that the data is protected against site failures and disasters.

In one example layout, four data chunks, D1 $30_{41}$, D2 $30_{42}$, D3 $30_{43}$, and D4 $30_{44}$, can be stored to zone A $30_{2A}$, zone B $30_{2A}$, zone C $30_{2C}$, and zone D $30_{2D}$, respectively. In one aspect, zone A $30_{2A}$, zone B $30_{2A}$, zone C $30_{2C}$, and/or zone D $30_{2D}$ can be substantially similar to frontend zone 100 and can include functionality as more fully described herein, for example, as described above with regard to frontend zone 100. Further, zone E $30_{2E}$ and zone F $30_{2F}$ are typically utilized to store coding chunks utilized for data protection associated with the data chunks (D1-D4). In one aspect, zone E $30_{2E}$ and/or zone F $30_{2F}$ can be substantially similar to backend zone 200 and can include functionality as more fully described herein, for example, as described above with regard to backend zone 200. In this example scenario, a 4+2 (k+m) erasure coding configuration can be utilized.

Figure 4:
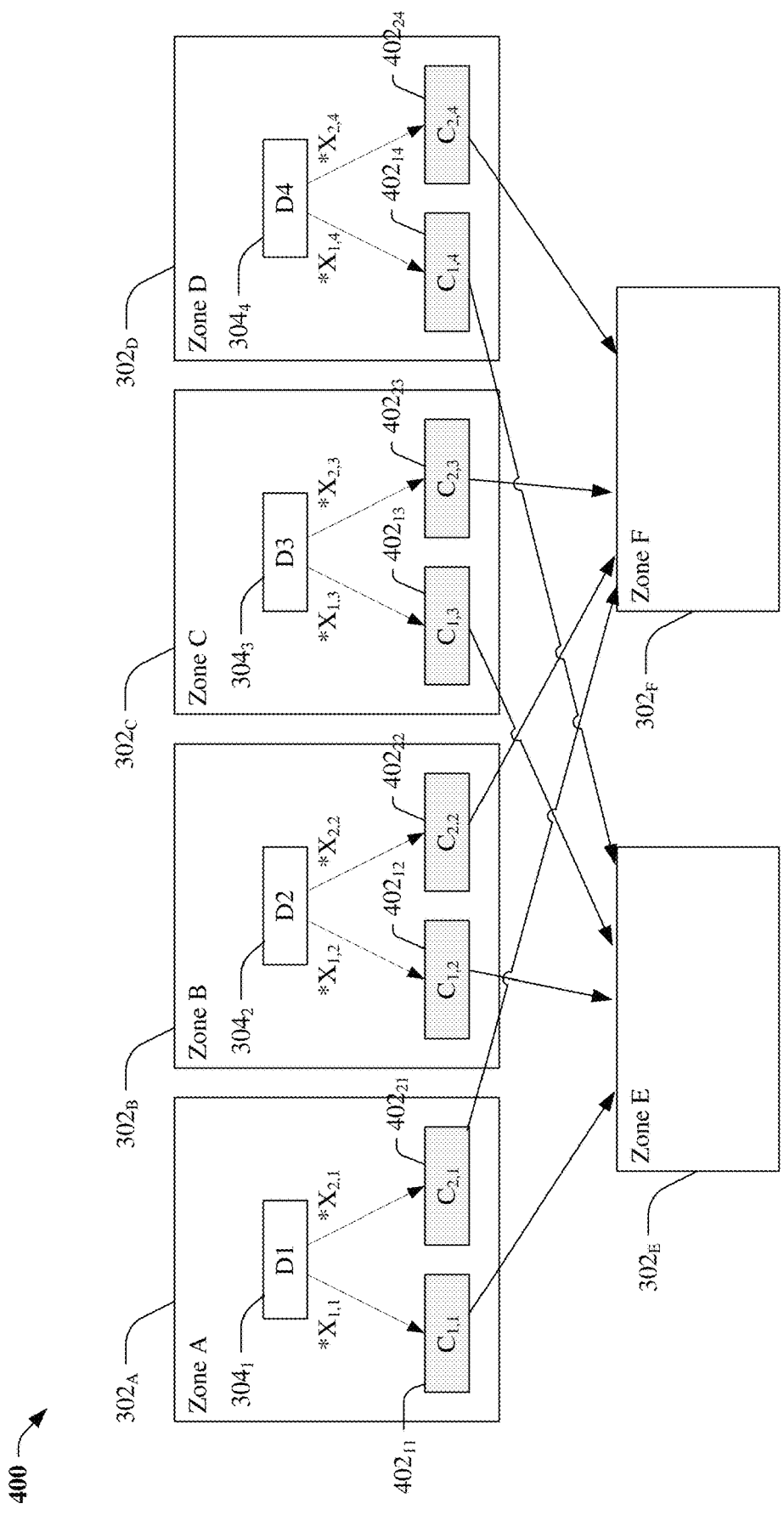
FIG. 4 illustrates an example system for creating partially-finished coding blocks during an initial phase of erasure coding.

Referring now to FIG. 4, there illustrated is an example system 400 for creating partially-finished coding blocks during an initial phase of erasure coding. During this initial phase of erasure coding, each zone, zone A $302_A$, zone B $302_A$, zone C $302_C$, zone D $302_D$, can create a chunk (D1 $304_1$, D2 $304_2$, D3 $304_3$, and D4 $304_4$, respectively) with user data. Each chunk $D_i$ (wherein i is an integer) is a data chunk $D_i$ to be encoded. According to an aspect, each of the zones (zone A $302_A$, zone B $302_A$, zone C $302_C$, zone D $302_D$) generates a set of partially-finished coding chunks from the data chunk (D1-D4 respectively) that it stores. As an example, a defined coding matrix is utilized to determine coefficients $X_{i,j}$. The partially-finished coding chunks ($C_{1,1}$ $402_{11}$, $C_{2,1}$ $402_{21}$, $C_{1,2}$ $402_{12}$, $C_{2,2}$ $402_{22}$, $C_{1,3}$ $402_{13}$, $C_{2,3}$ $402_{23}$, $C_{1,4}$ $402_{14}$, $C_{2,4}$ $402_{24}$) can be determined by combining the data chunk with the corresponding coefficients. In one example, partially-finished coding chunks ($C_{i,j}$) can be determined as follows:

$$C_{1,1} = D1 * X_{1,1} \tag{3}$$

$$C_{2,1} = D1 * X_{2,1} \tag{4}$$

$$C_{1,2} = D2 * X_{1,2} \tag{5}$$

$$C_{2,2} = D2 * X_{2,2} \tag{6}$$

$$C_{1,3} = D3 * X_{1,3} \tag{7}$$

$$C_{2,3} = D3 * X_{2,3} \tag{8}$$

$$C_{1,4} = D4 * X_{1,4} \tag{9}$$

$$C_{2,4} = D4 * X_{2,4} \tag{10}$$

The zones A-D can transfer the partially-finished coding chunks ($C_{i,j}$) to the remote zones E and F. For example, partially-finished coding chunks $C_{1,j}$ are transferred to zone E and partially-finished coding chunks $C_{2,j}$ are transferred to zone F. In one aspect, zones A-D can create the partially-finished coding chunks ($C_{i,j}$) as real chunks that are stored in the zones A-D. Alternatively, in another aspect, one or more of the zones A-D can transform a data chunk to the partially-finished coding chunks (e.g., via multiplication) on the fly, for example, while streaming data to remote zones (E and/or F). Subsequent to the partially-finished coding chunks ($C_{i,j}$) of a data chunk being moved to the remote zones completely, the data chunk is fully protected with replication. The partially-finished coding chunks comprise sufficient data to perform complete recovery of the data chunk if the latter is lost/unavailable (e.g., disaster recovery).

Figure 5:
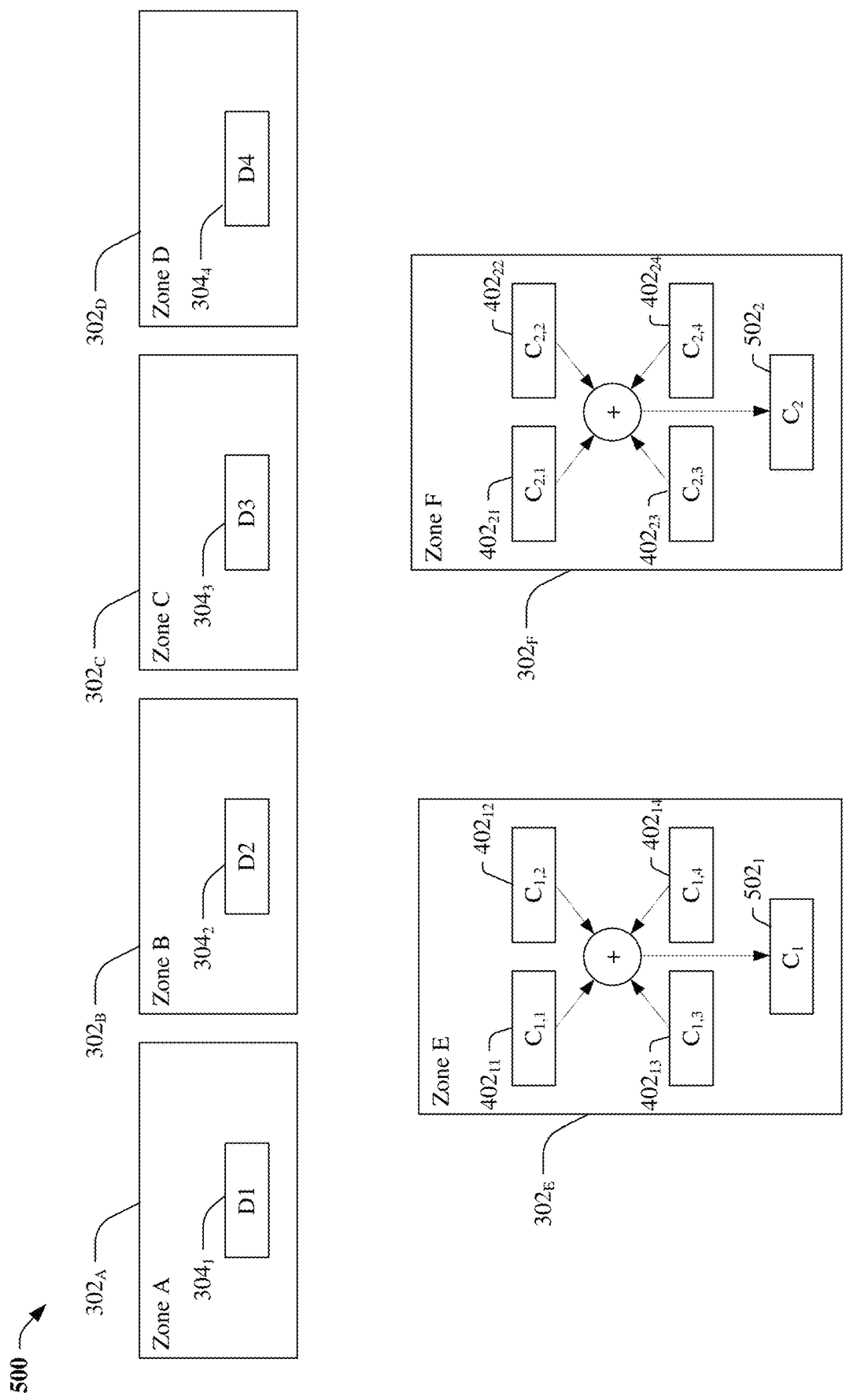
FIG. 5 illustrates an example system for generating complete coding chunks during a final phase of erasure coding.

FIG. 5 illustrates an example system 500 for generating complete coding chunks during a final phase of erasure coding. In one aspect, the remote zones receive the partially-finished coding chunks generated from the data chunks. For example, zone E $302_E$ can receive partially-finished coding chunks $C_{1,1}$ $402_{11}$, $C_{1,2}$ $402_{12}$, $C_{1,3}$ $402_{13}$, and $C_{1,4}$ $402_{14}$ from zone A $302_A$, zone B $302_A$, zone C $302_C$, and zone D $302_D$, respectively, and zone F $302_F$ can receive partially-finished coding chunks $C_{2,1}$ $402_{21}$, $C_{2,2}$ $402_{22}$, $C_{2,3}$ $402_{23}$, $C_{2,4}$ $402_{24}$ from zone A $302_A$, zone B $302_A$, zone C $302_C$, and zone D $302_D$, respectively. According to an aspect, zone E $302_E$ can generate a coding chunk $C_1$ $502_1$ based on combining (e.g., adding) partially-finished coding chunks $C_{2,1}$ $402_{21}$, $C_{2,2}$ $402_{22}$, $C_{2,3}$ $402_{23}$, $C_{2,4}$ $402_{24}$, and zone F $302_F$ can generate a coding chunk $C_2$ $502_2$ based on combining (e.g., adding) partially-finished coding chunks $C_{2,1}$ $402_{21}$, $C_{2,2}$ $402_{22}$, $C_{2,3}$ $402_{23}$, $C_{2,4}$ $402_{24}$. Since there are no primary backup copies of data chunks, each remote zone can generate the coding chunk independently (e.g., without communicating with each other). This eliminates the necessity to distribute coding chunks between the remote zones after encoding is completed.

Figure 6:
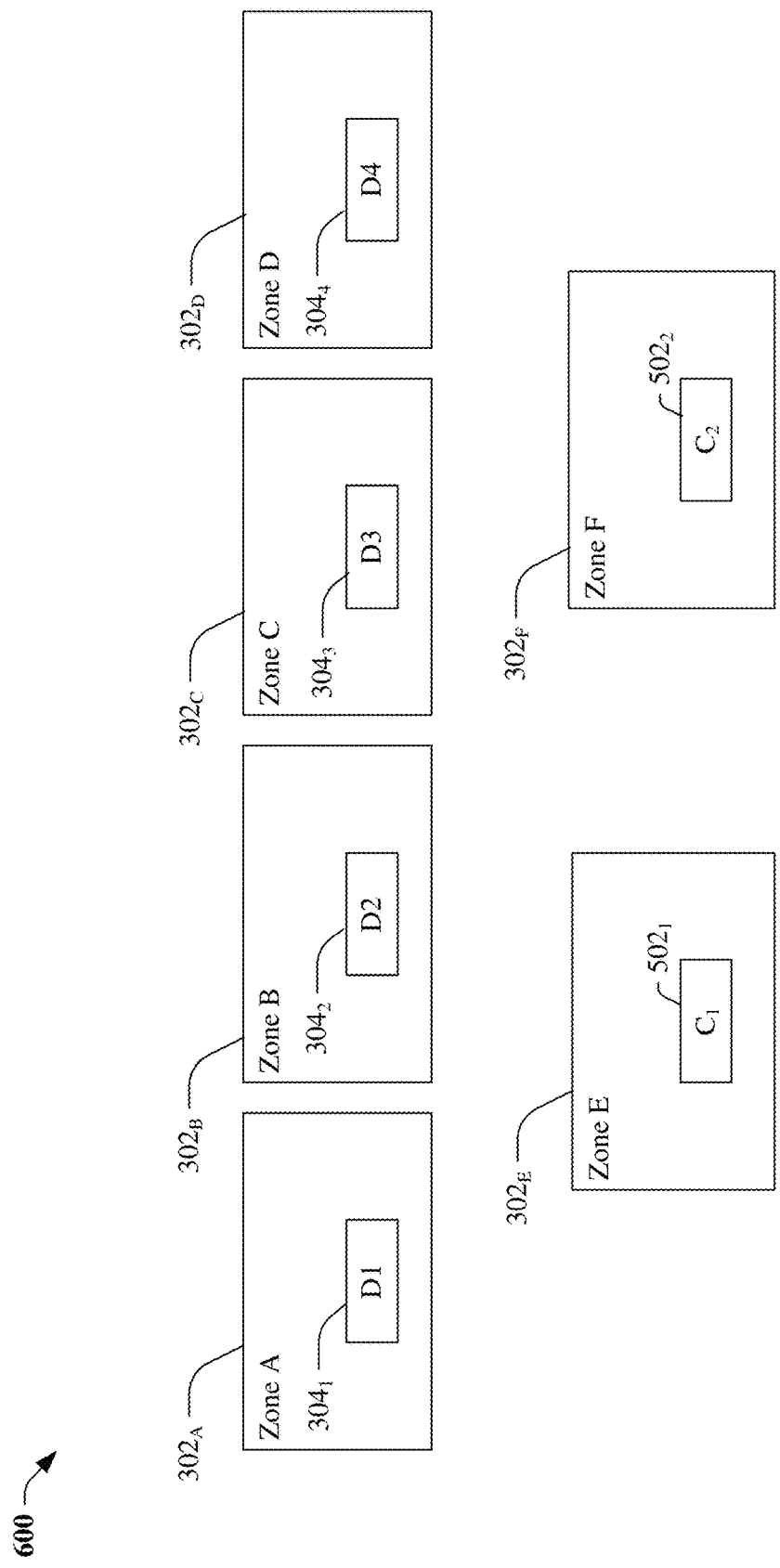
FIG. 6 illustrates an example system that depicts a data layout after encoding has been completed.

FIG. 6 illustrates an example system 600 that depicts a data layout after encoding has been completed. In an aspect, the partially-finished coding chunks ($C_{1,1}$ $402_{11}$, $C_{2,1}$ $402_{21}$, $C_{1,2}$ $402_{12}$, $C_{2,2}$ $402_{22}$, $C_{1,3}$ $402_{13}$, $C_{2,3}$ $402_{23}$, $C_{1,4}$ $402_{14}$, $C_{2,4}$ $402_{24}$) can be deleted.

Figure 7:
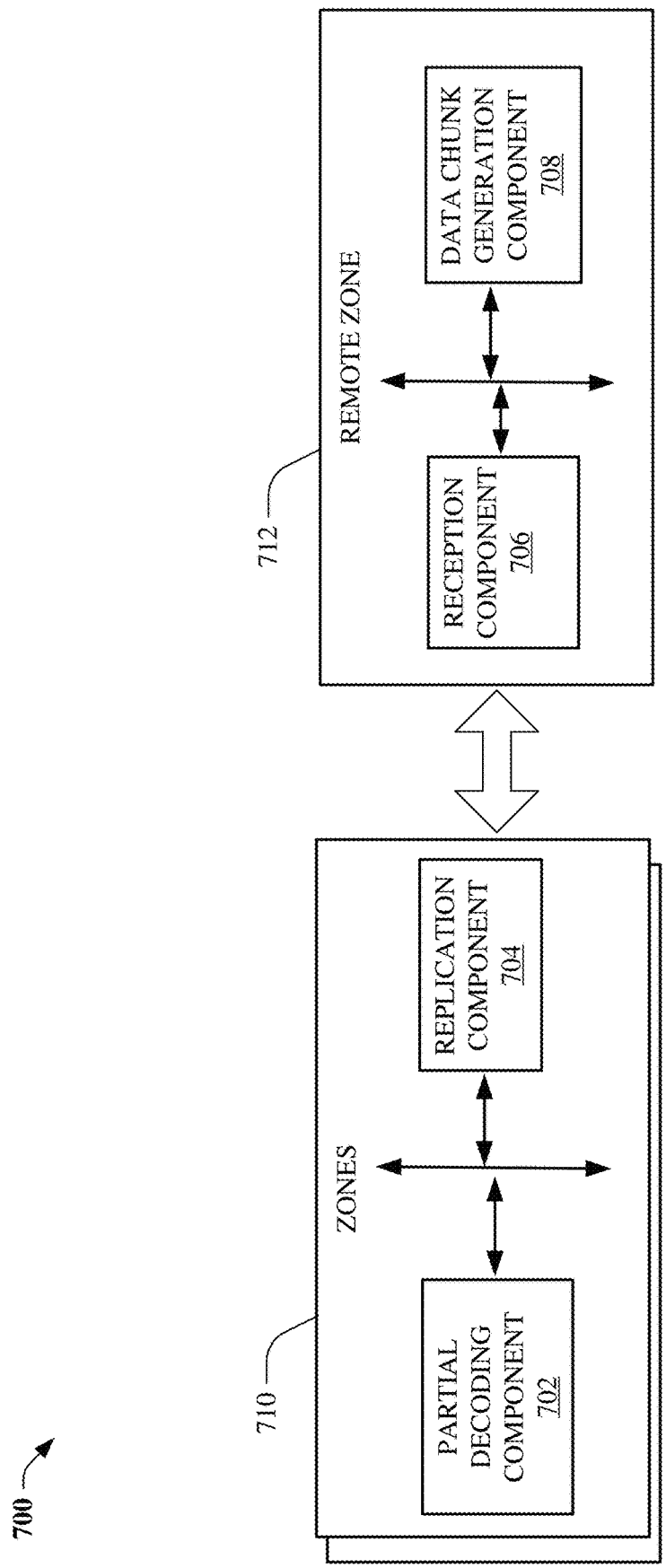
FIG. 7 illustrates an example system for recovery of data chunks, according to an aspect of the specification.

Referring now to FIG. 7, there illustrated is an example system 700 for recovery of data chunks, according to an aspect of the specification. Decoding is an inverse operation for the above described distributed encoding mechanism. In one aspect, a decoding matrix can be utilized for decoding that is different from the coding matrix (e.g., the coefficients in the coding and decoding matrices are different). According to an aspect, on determining that one or more zones have failed and/or are unavailable, the remaining available zones 710 can provide their chunk for decoding (e.g., during disaster recovery). For example, a partial decoding component 702 can perform an initial phase of decoding, wherein the data chunk can be combined with (e.g., multiplied by) the corresponding coefficients of the decoding matrix to generate a set of partially-finished data chunks. A replication component 704 can provide the set of partially-finished data chunks to one or more remote zones 712. The reception component 706 can receive the set of partially-finished data chunks and a data chunk generate component 708 can combine the set of partially-finished data chunks to recover the lost data chunk.

In one aspect, if there are two or more data chunks to recover, the data chunks can be recovered with the minimal coordination in a distributed fashion by different remote zones 712. Each remote zone sums (e.g., via their data chunk generate component 708) the partially-finished data chunks it has generated and/or has received, to produce a complete data chunk.

Figure 8:
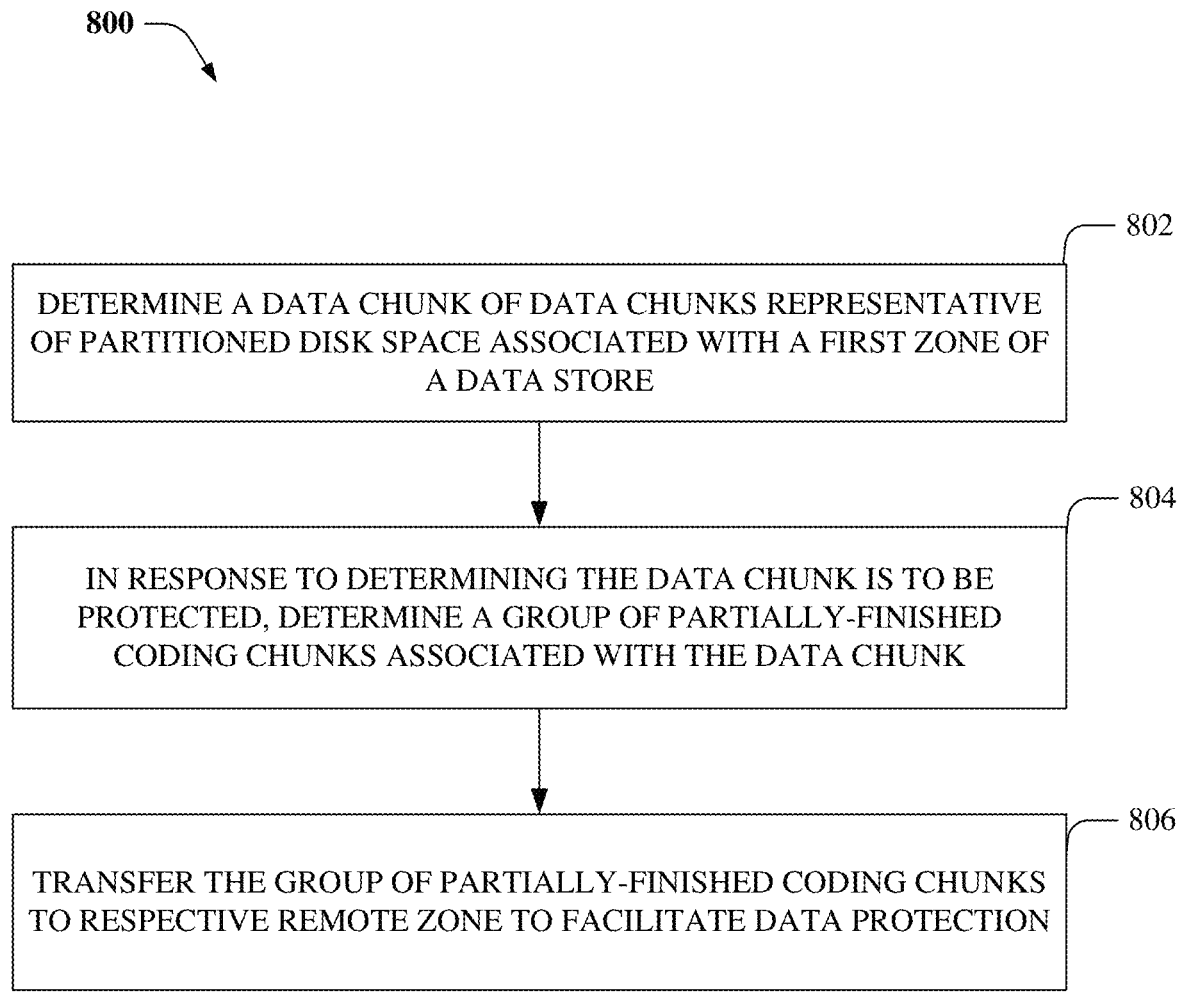
FIG. 8 illustrates an example method that facilitates distributed erasure coding.
Figure 9:
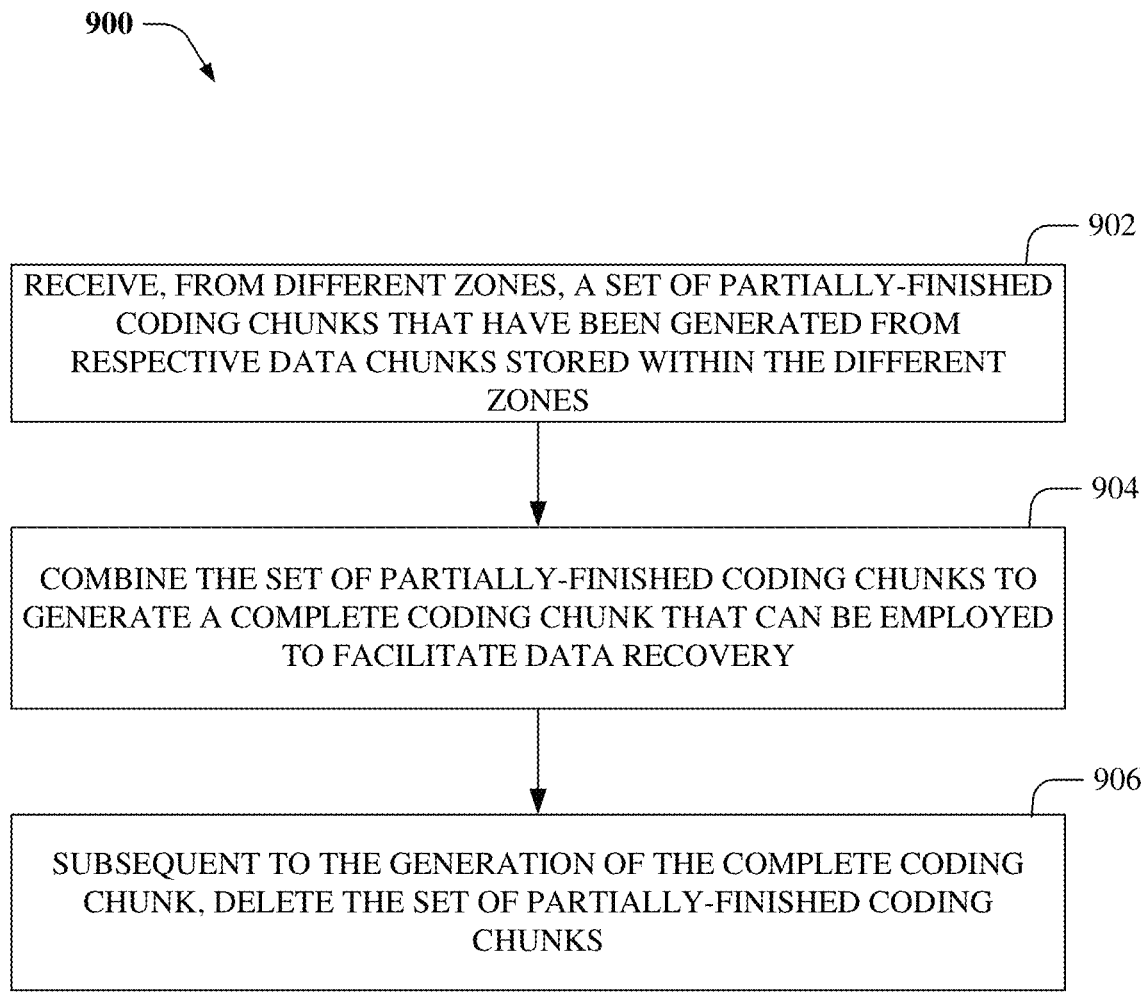
FIG. 9 illustrates an example method that facilitates generation of coding chunks, according to an aspect of the specification.

FIGS. 8-9 illustrate flow diagrams and/or methods in accordance with the disclosed subject matter. For simplicity of explanation, the flow diagrams and/or methods are depicted and described as a series of acts. It is to be understood and appreciated that the various embodiments are not limited by the acts illustrated and/or by the order of acts, for example acts can occur in various orders and/or concurrently, and with other acts not presented and described herein. Furthermore, not all illustrated acts may be required to implement the flow diagrams and/or methods in accordance with the disclosed subject matter. In addition, those skilled in the art will understand and appreciate that the methods could alternatively be represented as a series of interrelated states via a state diagram or events. Additionally, it should be further appreciated that the methods disclosed hereinafter and throughout this specification are capable of being stored on an article of manufacture to facilitate transporting and transferring such methods to computers. The term article of manufacture, as used herein, is intended to encompass a computer program accessible from any computer-readable device or computer-readable storage/communications media.

Referring now to FIG. 8, there illustrated is an example method 800 that facilitates distributed erasure coding. At 802, a data chunk, of data chunks representative of partitioned disk space associated with a first zone of a data store is determined. In response to the determining that the data chunk is to be protected, at element 804, a group of partially-finished coding chunks can be generated. As an example, the group of partially-finished coding chunks can be generated by combining (e.g., multiplying) the data chunk with corresponding coefficients from a defined coding matrix. At 806, the group of partially-finished coding chunks can be transferred to respective remote zones to facilitate protection of the data chunk. In an aspect, the remote zones can utilize the partially-finished coding chunks to generate complete coding chunks that can be utilized for data recovery in case the data chunk is lost/unavailable.

FIG. 9 illustrates an example method 900 that facilitates generation of coding chunks, according to an aspect of the specification. At 902, a set of partially-finished coding chunks can be received from different zones. As an example, the partially-finished coding chunks can be generated based on multiplying data chunks with corresponding coefficients from a defined coding matrix. At 904, the partially-finished coding chunks can be combined (e.g., added) to generate a complete coding chunk that can be utilized to facilitate data recovery (e.g., in case the data chunks are lost/unavailable). At 906, subsequent to the generation of the complete coding chunk, the set of partially-finished coding chunks can be deleted.

Figure 10:
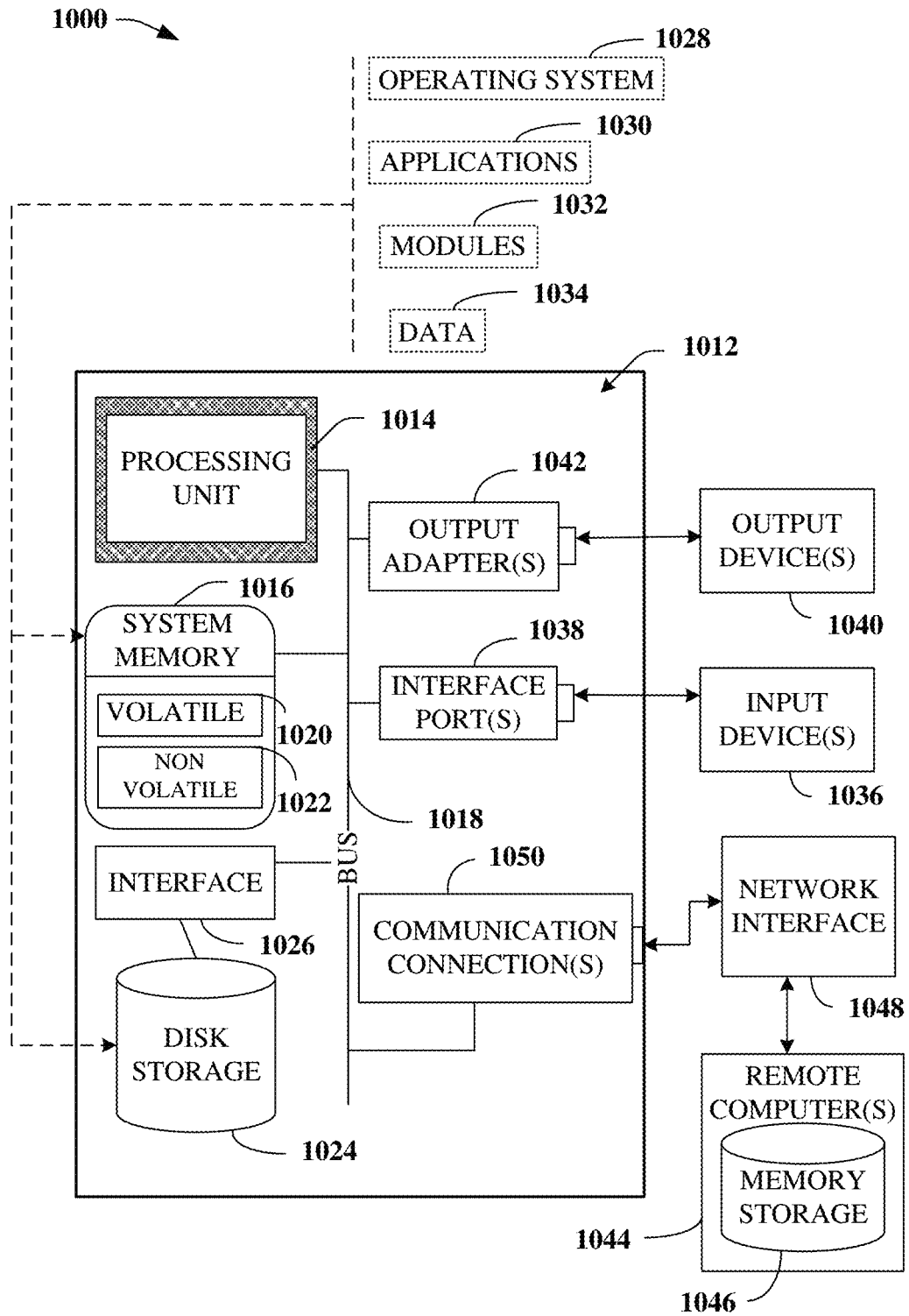
FIG. 10 illustrates a block diagram of an example computer operable to execute the disclosed storage system architecture.

Referring now to FIG. 10, there is illustrated a block diagram of an example computer operable to execute the distributed erasure coding. In order to provide additional context for various aspects of the disclosed subject matter, FIG. 10 and the following discussion are intended to provide a brief, general description of a suitable computing environment 1100 in which the various aspects of the specification can be implemented. While the specification has been described above in the general context of computer-executable instructions that can run on one or more computers, those skilled in the art will recognize that the specification also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices. The illustrated aspects of the specification can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media and/or communications media, which two terms are used herein differently from one another as follows. Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, (e.g., a carrier wave or other transport mechanism), and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, radio frequency (RF), infrared and other wireless media.

In order to provide a context for the various aspects of the disclosed subject matter, FIG. 10, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that various embodiments disclosed herein can be implemented in combination with other program modules. Generally, program modules comprise routines, programs, components, data structures, etc. that perform particular tasks and/or implement particular abstract data types.

Moreover, those skilled in the art will appreciate that the inventive systems can be practiced with other computer system configurations, comprising single-processor or multiprocessor computer systems, computing devices, mini-computing devices, mainframe computers, as well as personal computers, hand-held computing devices (e.g., PDA, phone, watch), microprocessor-based or programmable consumer or industrial electronics, and the like. The illustrated aspects can also be practiced in distributed computing environments where tasks are performed by remote processing devices that are linked through a communication network; however, some if not all aspects of the subject disclosure can be practiced on stand-alone computers. In a distributed computing environment, program modules can be located in both local and remote memory storage devices.

With reference to FIG. 10, a block diagram of a computing system 1000 operable to execute the disclosed systems and methods is illustrated, in accordance with an embodiment. Computer 1012 comprises a processing unit 1014, a system memory 1016, and a system bus 1018. As an example, the component(s), server(s), node(s), cluster(s), system(s), zone(s), module(s), agent(s), engine(s), and/or device(s) disclosed herein with respect to systems 100-700 can each include at least a portion of the computing system 1000. System bus 1018 couples system components comprising, but not limited to, system memory 1016 to processing unit 1014. Processing unit 1014 can be any of various available processors. Dual microprocessors and other multiprocessor architectures also can be employed as processing unit 1014.

System bus 1018 can be any of several types of bus structure(s) comprising a memory bus or a memory controller, a peripheral bus or an external bus, and/or a local bus using any variety of available bus architectures comprising, but not limited to, industrial standard architecture (ISA), micro-channel architecture (MSA), extended ISA (EISA), intelligent drive electronics (IDE), VESA local bus (VLB), peripheral component interconnect (PCI), card bus, universal serial bus (USB), advanced graphics port (AGP), personal computer memory card international association bus (PCMCIA), Firewire (IEEE 1394), small computer systems interface (SCSI), and/or controller area network (CAN) bus used in vehicles.

System memory 1016 comprises volatile memory 1020 and nonvolatile memory 1022. A basic input/output system (BIOS), containing routines to transfer information between elements within computer 1012, such as during start-up, can be stored in nonvolatile memory 1022. By way of illustration, and not limitation, nonvolatile memory 1022 can comprise ROM, PROM, EPROM, EEPROM, or flash memory. Volatile memory 1020 comprises RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1012 also comprises removable/non-removable, volatile/non-volatile computer storage media. FIG. 10 illustrates, for example, disk storage 1024. Disk storage 1024 comprises, but is not limited to, devices like a magnetic disk drive, floppy disk drive, tape drive, Jaz drive, Zip drive, LS-100 drive, flash memory card, or memory stick. In addition, disk storage 1024 can comprise storage media separately or in combination with other storage media comprising, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1024 to system bus 1018, a removable or non-removable interface is typically used, such as interface 1026.

It is to be appreciated that FIG. 10 describes software that acts as an intermediary between users and computer resources described in suitable operating environment 1000. Such software comprises an operating system 1028. Operating system 1028, which can be stored on disk storage 1024, acts to control and allocate resources of computer system 1012. System applications 1030 take advantage of the management of resources by operating system 1028 through program modules 1032 and program data 1034 stored either in system memory 1016 or on disk storage 1024. It is to be appreciated that the disclosed subject matter can be implemented with various operating systems or combinations of operating systems.

A user can enter commands or information into computer 1012 through input device(s) 1036. Input devices 1036 comprise, but are not limited to, a pointing device such as a mouse, trackball, stylus, touch pad, keyboard, microphone, joystick, game pad, satellite dish, scanner, TV tuner card, digital camera, digital video camera, web camera, cellular phone, user equipment, smartphone, and the like. These and other input devices connect to processing unit 1014 through system bus 1018 via interface port(s) 1038. Interface port(s) 1038 comprise, for example, a serial port, a parallel port, a game port, a universal serial bus (USB), a wireless based port, e.g., Wi-Fi, Bluetooth®, etc. Output device(s) 1040 use some of the same type of ports as input device(s) 1036.

Thus, for example, a USB port can be used to provide input to computer 1012 and to output information from computer 1012 to an output device 1040. Output adapter 1042 is provided to illustrate that there are some output devices 1040, like display devices, light projection devices, monitors, speakers, and printers, among other output devices 1040, which use special adapters. Output adapters 1042 comprise, by way of illustration and not limitation, video and sound devices, cards, etc. that provide means of connection between output device 1040 and system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. Remote computer(s) 1044 can be a personal computer, a server, a router, a network PC, a workstation, a microprocessor based appliance, a peer device, or other common network node and the like, and typically comprises many or all of the elements described relative to computer 1012.

For purposes of brevity, only a memory storage device 1046 is illustrated with remote computer(s) 1044. Remote computer(s) 1044 is logically connected to computer 1012 through a network interface 1048 and then physically and/or wirelessly connected via communication connection 1050. Network interface 1048 encompasses wire and/or wireless communication networks such as local-area networks (LAN) and wide-area networks (WAN). LAN technologies comprise fiber distributed data interface (FDDI), copper distributed data interface (CDDI), Ethernet, token ring and the like. WAN technologies comprise, but are not limited to, point-to-point links, circuit switching networks like integrated services digital networks (ISDN) and variations thereon, packet switching networks, and digital subscriber lines (DSL).

Communication connection(s) 1050 refer(s) to hardware/software employed to connect network interface 1048 to bus 1018. While communication connection 1050 is shown for illustrative clarity inside computer 1012, it can also be external to computer 1012. The hardware/software for connection to network interface 1048 can comprise, for example, internal and external technologies such as modems, comprising regular telephone grade modems, cable modems and DSL modems, wireless modems, ISDN adapters, and Ethernet cards.

The computer 1012 can operate in a networked environment using logical connections via wired and/or wireless communications to one or more remote computers, cellular based devices, user equipment, smartphones, or other computing devices, such as workstations, server computers, routers, personal computers, portable computers, microprocessor-based entertainment appliances, peer devices or other common network nodes, etc. The computer 1012 can connect to other devices/networks by way of antenna, port, network interface adaptor, wireless access point, modem, and/or the like.

The computer 1012 is operable to communicate with any wireless devices or entities operatively disposed in wireless communication, e.g., a printer, scanner, desktop and/or portable computer, portable data assistant, communications satellite, user equipment, cellular base device, smartphone, any piece of equipment or location associated with a wirelessly detectable tag (e.g., scanner, a kiosk, news stand, restroom), and telephone. This comprises at least Wi-Fi and Bluetooth® wireless technologies. Thus, the communication can be a predefined structure as with a conventional network or simply an ad hoc communication between at least two devices.

The computing system 1000 is operable to communicate with any wireless devices or entities operatively disposed in wireless communication, e.g., desktop and/or portable computer, server, communications satellite, etc. This includes at least WiFi and Bluetooth® wireless technologies. Thus, the communication can be a predefined structure as with a conventional network or simply an ad hoc communication between at least two devices.

WiFi, or Wireless Fidelity, allows connection to the Internet from a couch at home, a bed in a hotel room, or a conference room at work, without wires. WiFi is a wireless technology similar to that used in a cell phone that enables such devices, e.g., computers, to send and receive data indoors and out; anywhere within the range of a base station. WiFi networks use radio technologies called IEEE 802.11 (a, b, g, n, etc.) to provide secure, reliable, fast wireless connectivity. A WiFi network can be used to connect computers to each other, to the Internet, and to wired networks (which use IEEE 802.3 or Ethernet). WiFi networks operate in the unlicensed 5 GHz radio band at an 54 Mbps (802.11a) data rate, and/or a 2.4 GHz radio band at an 11 Mbps (802.11b), an 54 Mbps (802.11g) data rate, or up to an 600 Mbps (802.11n) data rate for example, or with products that contain both bands (dual band), so the networks can provide real-world performance similar to the basic 10BaseT wired Ethernet networks used in many offices.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory in a single machine or multiple machines. Additionally, a processor can refer to an integrated circuit, a state machine, an application specific integrated circuit (ASIC), a digital signal processor (DSP), a programmable gate array (PGA) including a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units. One or more processors can be utilized in supporting a virtualized computing environment. The virtualized computing environment may support one or more virtual machines representing computers, servers, or other computing devices. In such virtualized virtual machines, components such as processors and storage devices may be virtualized or logically represented. In an aspect, when a processor executes instructions to perform "operations", this could include the processor performing the operations directly and/or facilitating, directing, or cooperating with another device or component to perform the operations In the subject specification, terms such as "data store," data storage," "database," "cache," and substantially any other information storage component relevant to operation and functionality of a component, refer to "memory components," or entities embodied in a "memory" or components comprising the memory. It is noted that the memory components, or computer-readable storage media, described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

The illustrated aspects of the disclosure can be practiced in distributed computing environments where certain tasks are performed by remote processing devices that are linked through a communications network. In a distributed computing environment, program modules can be located in both local and remote memory storage devices.

The systems and processes described above can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders that are not all of which may be explicitly illustrated herein.

As used in this application, the terms "component," "module," "system," "interface," "cluster," "server," "node," or the like are generally intended to refer to a computer-related entity, either hardware, a combination of hardware and software, software, or software in execution or an entity related to an operational machine with one or more specific functionalities. For example, a component can be, but is not limited to being, a process running on a processor, a processor, an object, an executable, a thread of execution, computer-executable instruction(s), a program, and/or a computer. By way of illustration, both an application running on a controller and the controller can be a component. One or more components may reside within a process and/or thread of execution and a component may be localized on one computer and/or distributed between two or more computers. As another example, an interface can include input/output (I/O) components as well as associated processor, application, and/or API components.

Furthermore, the terms "user," "consumer," "client," and the like are employed interchangeably throughout the subject specification, unless context warrants particular distinction(s) among the terms. It is noted that such terms can refer to human entities or automated components/devices supported through artificial intelligence (e.g., a capacity to make inference based on complex mathematical formalisms), which can provide simulated vision, sound recognition and so forth.

Further, the various embodiments can be implemented as a method, apparatus, or article of manufacture using standard programming and/or engineering techniques to produce software, firmware, hardware, or any combination thereof to control a computer to implement one or more aspects of the disclosed subject matter. An article of manufacture can encompass a computer program accessible from any computer-readable device or computer-readable storage/communications media. For example, computer readable storage media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Of course, those skilled in the art will recognize many modifications can be made to this configuration without departing from the scope or spirit of the various embodiments.

Artificial intelligence based systems, e.g., utilizing explicitly and/or implicitly trained classifiers, can be employed in connection with performing inference and/or probabilistic determinations and/or statistical-based determinations as in accordance with one or more aspects of the disclosed subject matter as described herein. For example, an artificial intelligence system can be used to dynamically perform operations as described herein.

A classifier can be a function that maps an input attribute vector, x=(x1, x2, x3, x4, xn), to a confidence that the input belongs to a class, that is, f(x)=confidence (class). Such classification can employ a probabilistic and/or statistical-based analysis (e.g., factoring into the analysis utilities and costs) to infer an action that a user desires to be automatically performed. In the case of communication systems, for example, attributes can be information received from access points, servers, components of a wireless communication network, etc., and the classes can be categories or areas of interest (e.g., levels of priorities). A support vector machine is an example of a classifier that can be employed. The support vector machine operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein can also be inclusive of statistical regression that is utilized to develop models of priority.

In accordance with various aspects of the subject specification, artificial intelligence based systems, components, etc. can employ classifiers that are explicitly trained, e.g., via a generic training data, etc. as well as implicitly trained, e.g., via observing characteristics of communication equipment, e.g., a server, etc., receiving reports from such communication equipment, receiving operator preferences, receiving historical information, receiving extrinsic information, etc. For example, support vector machines can be configured via a learning or training phase within a classifier constructor and feature selection module. Thus, the classifier(s) can be used by an artificial intelligence system to automatically learn and perform a number of functions.

In addition, the word "example" or "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes examples of the present specification. It is, of course, not possible to describe every conceivable combination of components or methods for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
a processor; and
a memory that stores executable instructions that, when executed by the processor, facilitate performance of operations, comprising:
receiving, by a back-end storage zone of the system, partial coding chunks from respective front-end storage zones of a geographically distributed storage system, wherein each partial coding chunk is determined based on performing a distinct portion of a first phase of an erasure coding operation that encodes a distinct data chunk of distinct data chunks of a data element, where each distinct data chunk is stored within a different front-end storage zone of the respective front-end storage zones; and
performing, by the back-end storage zone, a second phase of the erasure coding operation that comprises combining the partial coding chunks to encode a final coding chunk.

2. The system of claim 1, wherein the combining comprises summing the partial coding chunks.

3. The system of claim 1, wherein each partial coding chunk is determined based on the distinct portion of a defined coding matrix data of the erasure coding operation.

4. The system of claim 3, wherein the defined coding matrix data comprises a set of defined coefficients, and wherein a first partial coding chunk of the partial coding chunks is determined based on a result of multiplying a first distinct data chunk of the distinct data chunks with a coefficient of the set of defined coefficients.

5. The system of claim 1, wherein the operations further comprise:
subsequent to encoding of the final coding chunk, deleting, by the back-end storage zone, the partial coding chunks.

6. The system of claim 1, wherein the final coding chunk is employable to recover at least one of the distinct data chunks during a failure.

7. The system of claim 6, wherein the least one of the distinct data chunks is recovered based on defined decoding matrix data.

8. The system of claim 1, wherein the geographically distributed storage system comprises a geographically distributed object storage system.

9. The system of claim 1, wherein the operations further comprise:
storing, by the back-end storage zone, the final coding chunk within a data store of another back-end storage zone of the geographically distributed storage system.

10. A method, comprising:
receiving, by a back-end storage zone of a system comprising a processor, partial coding chunks from respective front-end storage zones of a geographically distributed storage system, wherein the partial coding chunks are respectively determined based on partially encoding a respective distinct data chunk of distinct data chunks of a data item by utilizing a distinct portion of a first phase of a defined erasure coding scheme, where the distinct data chunks are stored within a different front-end storage zone of the respective front-end storage zones; and
performing, by the back-end storage zone of the system, a second phase of the erasure coding scheme that comprises aggregating the partial coding chunks to encode a final coding chunk that is employable for recovery of at least one of the distinct data chunks during a failure.

11. The method of claim 10, further comprising:
storing, by the back-end storage zone of the system, the final coding chunk within a data store of another back-end storage zone of the geographically distributed storage system.

12. The method of claim 11, further comprising:
in response to the storing, deleting, by the back-end storage zone of the system, the partial coding chunks.

13. The method of claim 10, wherein the partial coding chunks have been determined based on a respective distinct portion of coding matrix data associated with the defined erasure coding scheme.

14. The method of claim 13, wherein the coding matrix data comprises a set of defined coefficients, and wherein a first partial coding chunk of the partial coding chunks has been determined based on a combination of a first distinct data chunk of the distinct data chunks with a coefficient of the set of defined coefficients.

15. A non-transitory computer-readable medium comprising instructions that, in response to execution, cause a server device comprising a processor to perform operations, comprising:
in response to determining that distinct data chunks of a data element stored within respective front-end zones of a geographically distributed storage system are to be protected via erasure coding, determining groups of partial coding chunks, wherein each group of the groups of partial coding chunks comprises different partially encoded versions of the distinct data chunks generated by the respective front-end zones by performing a distinct portion of a first phase of an erasure coding operation; and
facilitating a transfer of the groups of partial coding chunks to respective back-end zones of the geographically distributed storage system to facilitate encoding, by a second phase of the erasure coding operation, respective complete coding chunks that are employable to recover at least one of the distinct data chunks during a failure.

16. The non-transitory computer-readable medium of claim 15, wherein the determining comprises determining the groups of partial coding chunks based on defined coding matrix data.

17. The non-transitory computer-readable medium of claim 16, wherein the defined coding matrix data is indicative of coefficients.

18. The non-transitory computer-readable medium of claim 17, wherein the groups of partial coding chunks are determined based on combining the distinct data chunks with different corresponding coefficients of the coefficients.

19. The non-transitory computer-readable medium of claim 15, wherein a complete coding chunk of the complete coding chunks is encoded based on the second phase of the erasure coding operation that comprises a summation of the different partially encoded versions of the distinct data chunks of a group of partial coding chunks.

20. The non-transitory computer-readable medium of claim 15, wherein the geographically distributed storage system comprises a geographically distributed object storage system.

* * * * *